(12) United States Patent
Shibata et al.

(10) Patent No.: US 7,374,275 B2
(45) Date of Patent: May 20, 2008

(54) INK JET HEAD CIRCUIT BOARD WITH HEATERS AND ELECTRODES CONSTRUCTED TO REDUCE CORROSION, METHOD OF MANUFACTURING THE SAME AND INK JET HEAD USING THE SAME

(75) Inventors: Kazuaki Shibata, Kawasaki (JP); Kenji Ono, Tokyo (JP); Teruo Ozaki, Yokohama (JP); Satoshi Ibe, Yokohama (JP); Ichiro Saito, Yokohama (JP); Sakai Yokoyama, Kawasaki (JP); Toshiyasu Sakai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 377 days.

(21) Appl. No.: 11/202,078

(22) Filed: Aug. 12, 2005

(65) Prior Publication Data

US 2006/0033778 A1    Feb. 16, 2006

(30) Foreign Application Priority Data

Aug. 16, 2004    (JP)    .............. 2004-236605

(51) Int. Cl.
*B41J 2/05*    (2006.01)
(52) U.S. Cl. .......................................... 347/56; 347/63
(58) Field of Classification Search ................ 347/20, 347/56–59, 61–65, 67
See application file for complete search history.

(56) References Cited

U.S. PATENT DOCUMENTS

| | | | |
|---|---|---|---|
| 4,686,544 A | 8/1987 | Ikeda et al. ................ 347/64 |
| 4,723,129 A | 2/1988 | Endo et al. ................ 347/56 |
| 4,740,796 A | 4/1988 | Endo et al. ................ 347/56 |
| 4,866,460 A * | 9/1989 | Shiozaki ................ 347/58 |
| 5,660,739 A | 8/1997 | Ozaki et al. ................ 347/62 |
| 6,062,679 A | 5/2000 | Meyer et al. ................ 347/63 |
| 6,357,862 B1 | 3/2002 | Ozaki et al. ................ 347/58 |
| 6,374,482 B1 * | 4/2002 | Mihara et al. ................ 29/611 |
| 6,474,788 B1 | 11/2002 | Saito et al. ................ 347/58 |
| 6,485,131 B1 | 11/2002 | Saito et al. ................ 347/64 |
| 6,499,833 B2 * | 12/2002 | Sugioka ................ 347/57 |
| 6,530,650 B2 | 3/2003 | Ozaki et al. ................ 347/64 |

(Continued)

FOREIGN PATENT DOCUMENTS

EP    0 277 756    8/1988

(Continued)

*Primary Examiner*—Juanita D Stephens
(74) *Attorney, Agent, or Firm*—Fitzpatrick, Cella, Harper & Scinto

(57) ABSTRACT

An ink jet head circuit board is provided which has heaters to generate thermal energy for ink ejection as they are energized. This circuit board has the heaters formed with high precision to reduce their areas. It also has provisions to protect the electrode wires against corrosion and prevent a progress of corrosion. The substrate is deposited with the thin first electrodes made of a corrosion resistant metal. This is further deposited with the resistor layer. The second electrodes made of aluminum are deposited to overlap the first electrodes to form the heater without causing large dimensional variations among the heaters. With this construction, if a defect should occur in a protective layer on or near the heater, a progress of corrosion can effectively be prevented because the material of the resistor layer is more resistant to encroachment than aluminum and the first electrodes are corrosion resistant.

18 Claims, 13 Drawing Sheets

U.S. PATENT DOCUMENTS

| | | |
|---|---|---|
| 6,663,228 B2 | 12/2003 | Saito et al. .................... 347/64 |
| 6,997,546 B2 | 2/2006 | Imanaka et al. ............... 347/59 |
| 2002/0093553 A1 | 7/2002 | Mihara et al. ................. 347/61 |
| 2006/0033779 A1 | 2/2006 | Shibata et al. ................. 347/59 |
| 2006/0098053 A1 | 5/2006 | Saito et al. .................... 347/64 |

FOREIGN PATENT DOCUMENTS

| | | |
|---|---|---|
| EP | 0 674 995 | 10/1995 |
| EP | 0 768 182 | 4/1997 |
| EP | 0 906 828 | 4/1999 |
| JP | 63-191645 A | 8/1988 |
| JP | 4-45740 U | 4/1992 |
| JP | 2611981 B2 | 2/1997 |
| JP | 2001-038919 A | 2/2001 |
| JP | 2003-341075 A | 12/2003 |
| KR | 1999023939 A | 3/1999 |

* cited by examiner

INK JET HEAD CIRCUIT BOARD WITH HEATERS AND ELECTRODES CONSTRUCTED TO REDUCE CORROSION, METHOD OF MANUFACTURING THE SAME AND INK JET HEAD USING THE SAME

BACKGROUND OF THE INVENTION

1. Field of the Invention

The present invention relates to a circuit board for an ink jet head that ejects ink for printing, a method of manufacturing the circuit board, and an ink jet head using the circuit board.

2. Description of the Related Art

An ink jet printing system has an advantage of low running cost because an ink jet head as a printing means can easily be reduced in size, print a high-resolution image at high speed and even form an image on so-called plain paper that is not given any particular treatment. Other advantages include low noise that is achieved by a non-impact printing system employed by the print head and an ability of the print head to easily perform color printing using multiple color inks.

There are a variety of ejection methods available for the ink jet head to realize the ink jet printing system. Among others, ink jet heads using thermal energy to eject ink, such as those disclosed in U.S. Pat. Nos. 4,723,129 and 4,740,796, generally have a construction in which a plurality of heaters to heat ink to generate a bubble in ink and wires for heater electrical connection are formed in one and the same substrate to fabricate an ink jet head circuit board and in which ink ejection nozzles are formed in the circuit board on their associated heaters. This construction allows for easy and high-precision manufacture, through a process similar to a semiconductor fabrication process, of an ink jet head circuit board incorporating a large number of heaters and wires at high density. This helps to realize higher print resolution and faster printing speed, which in turn contributes to a further reduction in size of the ink jet head and a printing apparatus using it.

FIG. 1 and FIG. 2 are a schematic plan view of a heater in a general ink jet head circuit board and a cross-sectional view taken along the line II-II of FIG. 1. As shown in FIG. 2, on a substrate 120 is formed a resistor layer 107 as a lower layer, over which an electrode wire layer 103 is formed as an upper layer. A part of the electrode wire layer 103 is removed to expose the resistor layer 107 to form a heater 102. Electrode wire patterns 205, 207 are wired on the substrate 120 and connected to a drive element circuit and external power supply terminals for supply of electricity from outside. The resistor layer 107 is formed of a material with high electric resistance. Supplying an electric current from outside to the electrode wire layer 103 causes the heater 102, a portion where no electrode wire layer 103 exists, to generate heat energy creating a bubble in ink. Materials of the electrode wire layer 103 mainly include aluminum or aluminum alloy.

The ink jet head circuit board employs a protective layer deposited on the heater only to ensure a reduced consumption of electricity by reducing applied electrical energy but also to prevent possible mechanical damages caused by cavitations from repeated creation and collapse of bubbles in ink and also prevent a reduced longevity of the circuit board which may be caused by the heater 102 being broken as they are repetitively applied electric pulse energy for heating.

The protective layer, when viewed from a standpoint of heat or energy efficiency, preferably has a high heat conductivity or is formed thin. On the other hand, the protective layer has a function of protecting electrode wires leading to the heaters 102 from ink. In terms of a probability of defects occurring in layers during the circuit board fabrication process, it is advantageous to increase the thickness of the protective layer. Therefore, to make a balanced tradeoff between energy efficiency and reliability, the protective layer is set to an appropriate thickness.

However, the protective layer is subject to mechanical damages from cavitations caused by creation of bubbles in ink and also to chemical damages caused by chemical reactions between ink components and materials making up the protective layer at high temperatures to which the protective layer's surface in contact with the heaters rises immediately after bubbles are formed. Hence, the function to insulate and protect the wires from ink and the function to protect against mechanical and chemical damages are difficult to achieve at the same time. It is therefore a common practice to form the protective layer on the ink jet head circuit board in a two-layer structure, and to form as an upper layer, a highly stable layer capable of withstanding mechanical and chemical damages and, as a lower layer, a protective insulation layer to protect the wires.

More specifically, it is common practice to form as the upper layer a Ta layer with very high mechanical and chemical stability and, as the lower layer, a SiN or SiO layer which is stable and easy to deposit using the existing semiconductor fabrication equipment. In more detail, a SiN layer is deposited on the wires to a thickness of about 0.2-1 µm as the lower protective layer (protective insulation layer) 108 and then, as the upper protective layer (generally called an anticavitation layer because of its capability to resist possible damages from cavitations) 110, a Ta layer is deposited to a thickness of 0.2-0.5 µm. This structure meets the contradictory requirements of an improved electrothermal conversion efficiency and a longer service life of the ink jet head circuit board on one hand and its improved reliability on the other.

For reduced power consumption and improved heat efficiency of the ink jet head, efforts are being made in recent years to increase a resistance of individual resistors. So, even minute variations in heater size will greatly affect resistance variations among the heaters. If resistance variations result in differences in bubble generation phenomenon among the heaters, not only can the required amount of ink for one nozzle not be stably secured but the amount of ink also varies greatly among the different nozzles, leading to a degradation of printed image quality. Under these circumstances, an improved precision in patterning the electrode wires at the heaters is being called for more than ever.

Ink jet printers, as they proliferate, are facing increasing demands for higher printing resolution, higher image quality and faster printing speed. One of solutions to the demands for higher resolution and image quality involves reducing an amount of ink ejected to form a dot (or a diameter of an ink droplet when ink is ejected in the form of droplets). The requirement for reducing the ink ejection volume has conventionally been dealt with by changing the shape of nozzles (reducing orifice areas) and reducing the area of heater (width W×length L in FIG. 1). As the heater become smaller in size, the relative effect of heater size variations becomes more significant. This constitutes one of factors calling for improved precision of electrode wire patterning at the locations of heater.

On the other hand, from the standpoint of reducing the amount of electricity consumed by the circuit board as a whole, it is important to lower a resistance of electrode wires. Normally, the resistance of electrode wires is reduced by increasing the width of the electrode wires formed on a circuit board. However, given a situation where the number of heaters formed in the circuit board is very large and there is a growing trend for reducing the area of individual heaters, it is becoming more and more difficult to secure enough space to allow the electrode wires to be increased in width without increasing the size of the circuit board. On top of that, increasing the width of electrode wires imposes limitations on high-density integration of small-area heaters or nozzles.

It may be conceived to achieve a reduced resistance of electrode wires by increasing their thickness. This method, however, renders the improvement in the patterning precision of the heaters difficult.

This is explained by referring to FIG. 1 through FIG. 3.

First, in the construction shown in FIG. 1 and FIG. 2, in those areas where the heaters 102 are to be formed, an electrode wire layer 103' is etched away to expose a resistor layer. Here, considering the coverage of the protective insulation layer 108 and the anticavitation layer 110, the electrode wire layer 103' is wet-etched into a tapered shape. Since the wet etching proceeds isotropically, errors caused by etching, particularly dimensional tolerance in the longitudinal direction of the heater 102, are proportional to the thickness of the electrode wire layer 103'.

FIG. 3 shows a relation between a thickness of aluminum electrode wire layer and a dimensional tolerance in a direction L, with abscissa representing a multiplication factor of a thickness of 0.3 µm (300 nm) and ordinate representing a dimensional tolerance (µm). As can be seen from this diagram, for a thickness with multiplication factor=1, the dimensional tolerance is 0.5 µm; for a thickness with multiplication factor=1.7, the dimensional tolerance is about 1 µm; and for a thickness with multiplication factor=2.9, the dimensional tolerance is about 2 µm. This shows that as the length L is made smaller to match the reducing area of the heater 102, the influence of tolerance variations increases.

As described above, it is extremely difficult to meet both of the two requirements at the same time, one for increasing the resistance of resistors and reducing the area of heaters and one for increasing the thickness of electrode wires. They in turn require a very high precision of patterning.

SUMMARY OF THE INVENTION

The present invention has been accomplished to overcome the above problems and it is a primary object of this invention to make it possible to form heaters with high precision and thereby meet the demand for increased resistance of resistors and reduced heater areas, thus contributing to reduced consumption of electricity, improved heat efficiency, and higher printing resolution and higher image quality.

It is also an object of this invention to provide, by the technology described above, a small, reliable ink jet head capable of performing stable printing operations.

In a first aspect of the present invention, there is provided an ink jet head circuit board having heaters to generate thermal energy for ejecting ink as they are energized; the ink jet head circuit board comprising:

first electrodes having a gap therebetween in which to form the heater;

a resistor layer formed on the first electrodes including the gap; and second electrodes formed on the first electrodes and having a gap larger than the gap of the first electrodes;

wherein the first electrodes have a thickness smaller than that of the second electrodes.

In a second aspect of the present invention, there is provided a method of fabricating an ink jet head circuit board, wherein the ink jet head circuit board has heaters to generate thermal energy for ejecting ink as they are energized; the method comprising the steps of:

forming on a substrate first electrodes having a gap therebetween in which to form the heater;

forming a resistor layer on the first electrodes including the gap; and forming on the first electrodes and the resistor layer a layer for second electrodes, the second electrodes having a greater thickness than that of the first electrodes, and then removing from the layer a gap portion larger than the gap of the first electrodes to form second electrodes, the gap portion having its ends situated over the first electrodes.

In a third aspect of the present invention, there is provided an ink jet head comprising:

the above ink jet head circuit board; and ink ejection nozzles corresponding to the heaters.

With this invention, since the heater can be formed in each of gaps of a first electrode layer whose thickness is reduced, dimensional variations among the heaters can be made small, improving the step coverage of the resistor layer and the overlying protective layers. This makes it possible to meet the demands for higher resistance of resistors and smaller heater areas, which in turn contributes to reducing consumption of electricity, improving heat efficiency, and enhancing printing resolution and image quality. As a result, the circuit board and ink jet head have improved reliability and durability.

It is therefore possible to provide a small, reliable ink jet head capable of performing stable printing operations.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Now, the present invention will be described in detail by referring to the accompanying drawings.

(First Embodiment of Ink Jet Head Circuit Board and Process of Manufacturing the Same)

Figure 1:
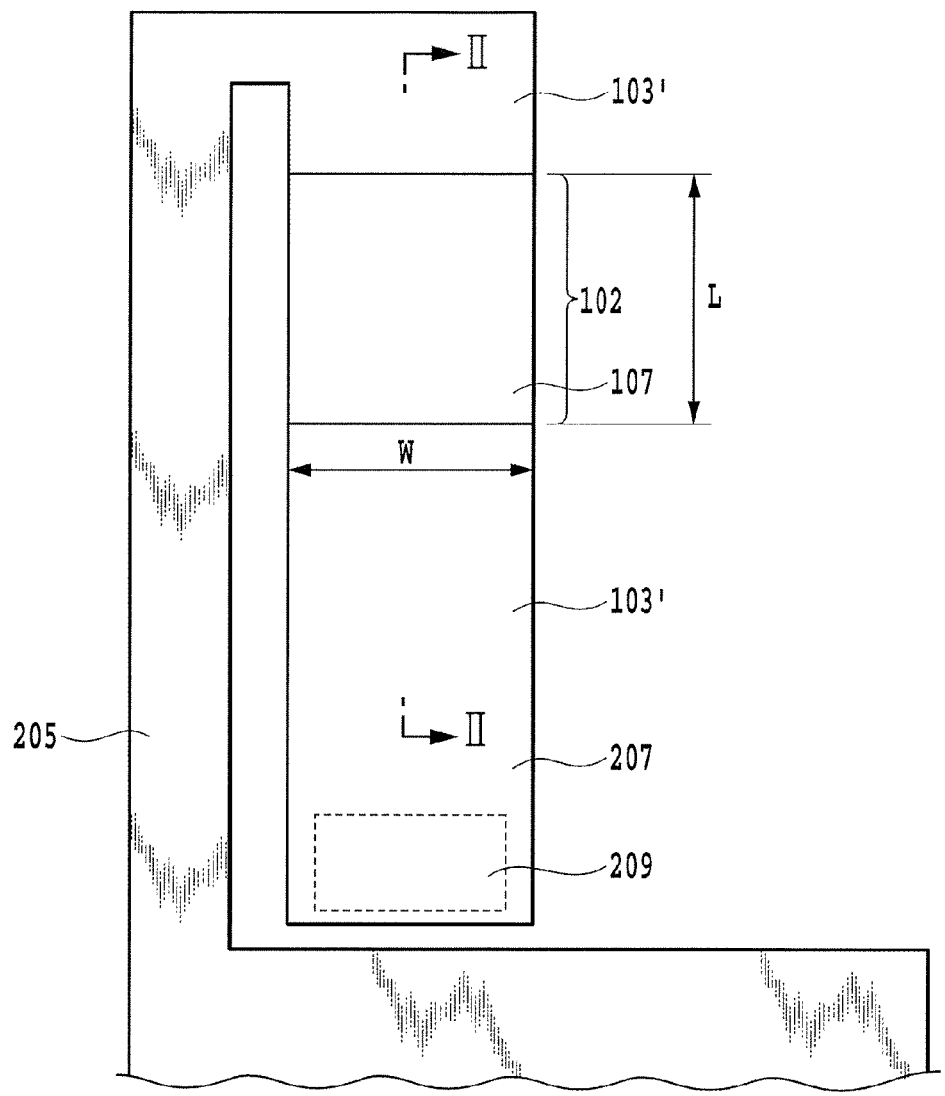
FIG. 1 is a schematic plan view showing a heater in a conventional ink jet head circuit board.
Figure 4:
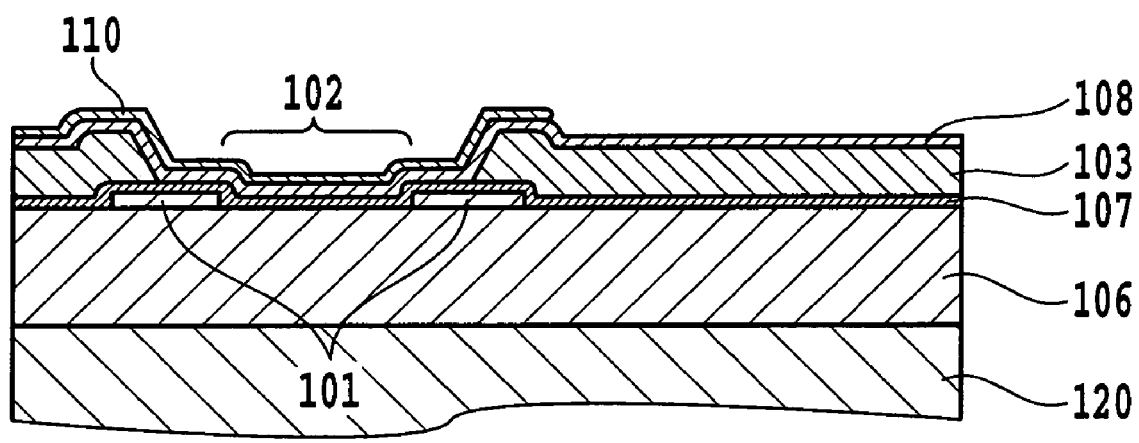
FIG. 4 is a schematic cross-sectional view showing a heater in an ink jet head circuit board according to a first embodiment of this invention.

FIG. 4 is a schematic cross-sectional view of a heater in an ink jet head circuit board according to the first embodiment of the invention, taken along the line II-II of FIG. 1. In this figure, components that function in the same way as those in FIG. 2 are given like reference numbers.

As shown in FIG. 4, a pair of electrodes 101 spaced a desired distance apart is deposited over a substrate 120 with an insulation layer 106 in between. A resistor layer 107 is deposited over these layers to form a heater 102. In this embodiment the electrodes 101 are formed of a corrosion resistant metal. An electrode wire layer 103 formed of Al or an alloy containing Al has a gap in it larger than the space between the paired electrodes 101 and is electrically connected to the electrodes 101 through the resistor layer 107. That is, the heater 102 is formed in the space between the electrodes 101 which therefore defines the dimension of the heater. The electrode wire layer 103 is wired over the substrate 120 and connected to a drive element circuit or external power supply terminals. The ends of the electrode wire layer 103 are situated on the electrodes 101, with the resistor layer 107 interposed therebetween. In the following, the electrodes 101 that form the heater 102 and also define the dimension of the latter is referred to as a first electrode and the electrode wire layer 103 as a second electrode.

Referring to FIG. 5A to FIG. 5D, an example process of manufacturing the ink jet head circuit board of FIG. 4 will be explained.

Figure 2:
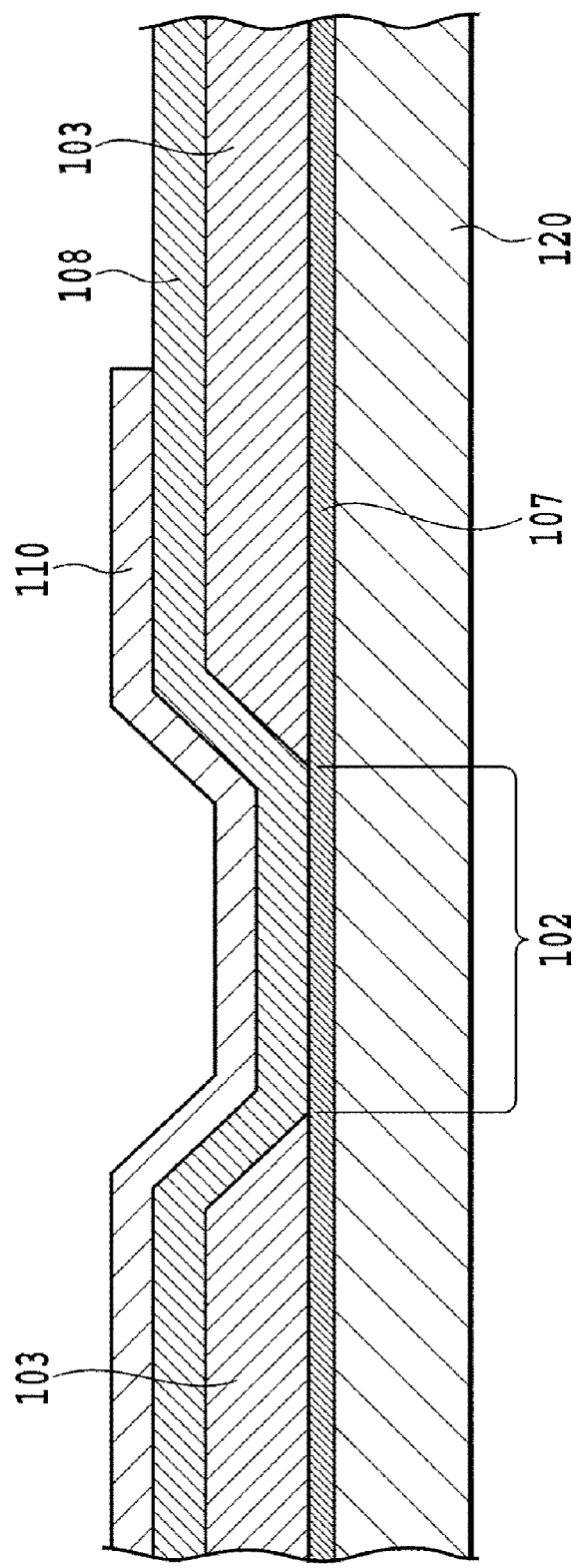
FIG. 2 is a cross-sectional view taken along the line II-II of FIG. 1.
Figure 3:
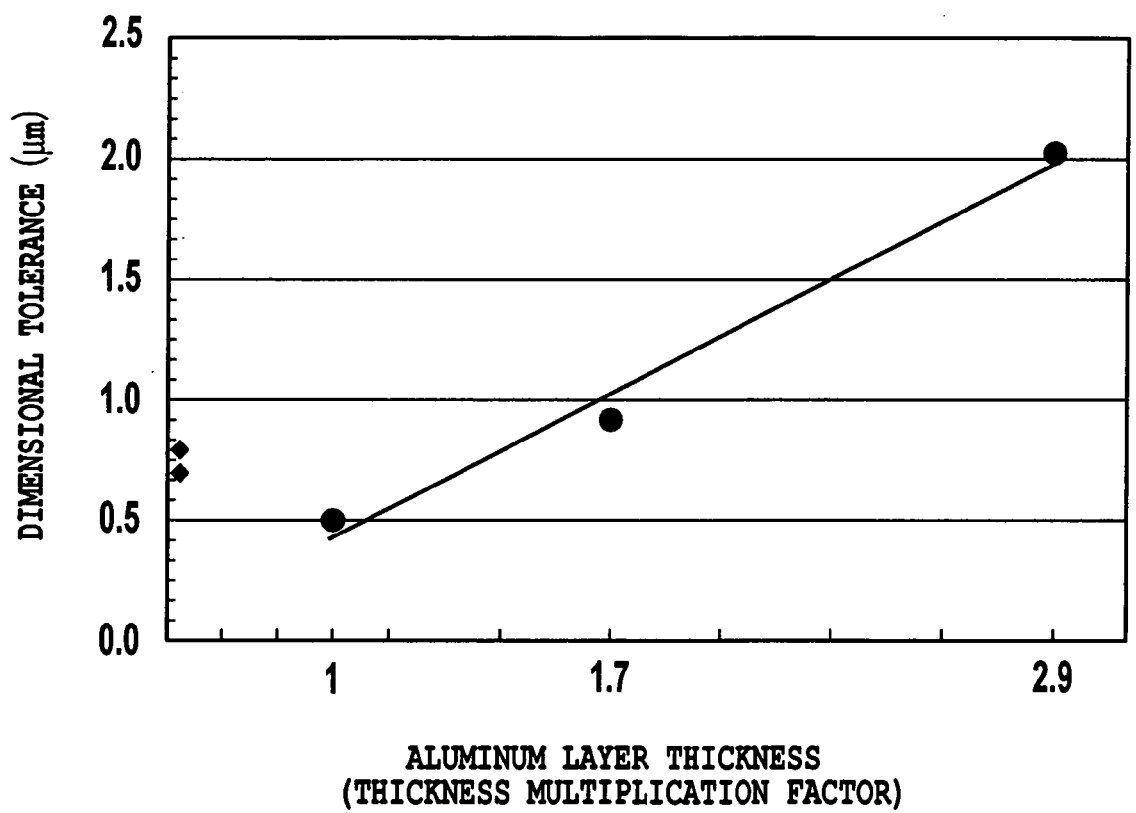
FIG. 3 is a graph showing a relation between a thickness of an electrode wire layer forming a heater and a dimensional tolerance of heater area.
Figure 5A:
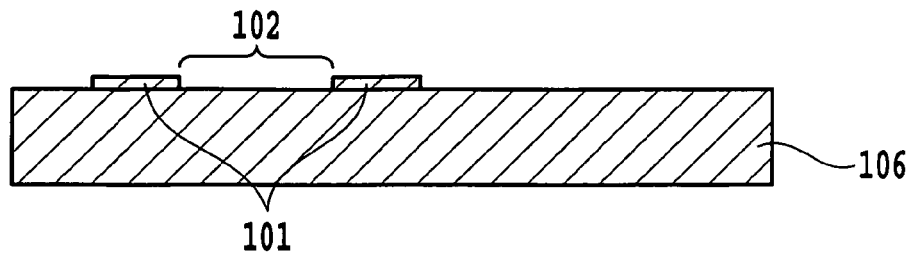
FIG. 5A to FIG. 5D are schematic cross-sectional views showing a process of fabricating a circuit board of FIG. 4.

First, in FIG. 5A, a substrate (not shown) formed of silicon as in FIG. 2 is prepared and deposited with an insulation layer 106. Here, the substrate may have prefabricated in a <100> Si substrate a drive circuit, made up of semiconductor elements such as switching transistors, to selectively drive the heaters 102. Further, on the insulation layer 106 a corrosion resistant metal, such as Ta layer, is sputtered to a thickness of 100 nm and then patterned into a desired shape to form the first electrodes 101.

Figure 5B:
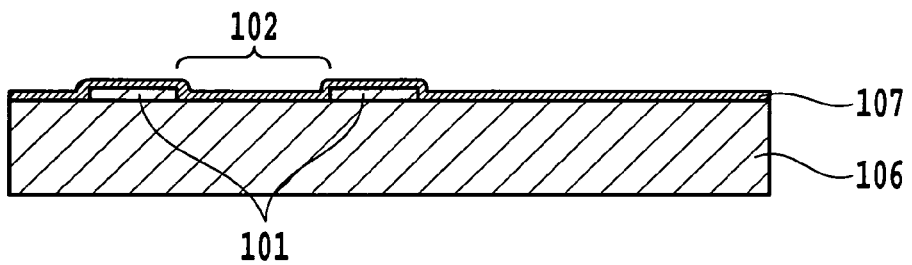

Next, as shown in FIG. 5B, TaSiN is sputtered to a thickness of about 50 nm to form a resistor layer 107. Then, a layer of Al is deposited to a thickness of about 350 nm to form a wire layer. This is covered with a desired shape of resist patterned by photolithography which corresponds to a pattern of the second electrodes 103. The Al layer is then subjected to a reactive ion etching (RIE) using a gas mixture of, for instance, $BCl_3$ and $Cl_2$ to form the desired pattern of second electrodes 103.

Figure 5C:
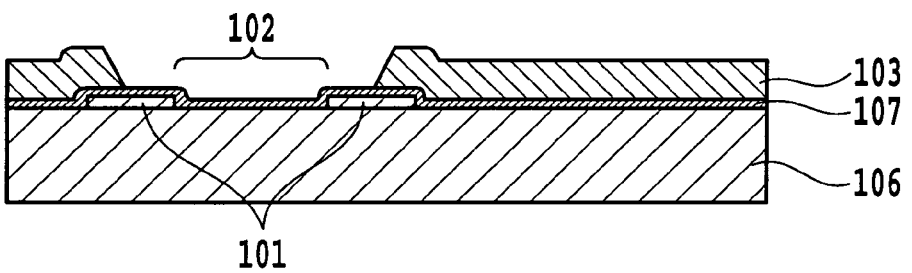

Then, as shown in FIG. 5C, to remove the aluminum layer from those portions near the heater 102 that will become gaps in the second electrodes 103, a resist of a desired shape is applied using photolithography and the aluminum layer is etched away by a wet etching using phosphoric acid as a main component to form the second electrodes 103.

Figure 5D:
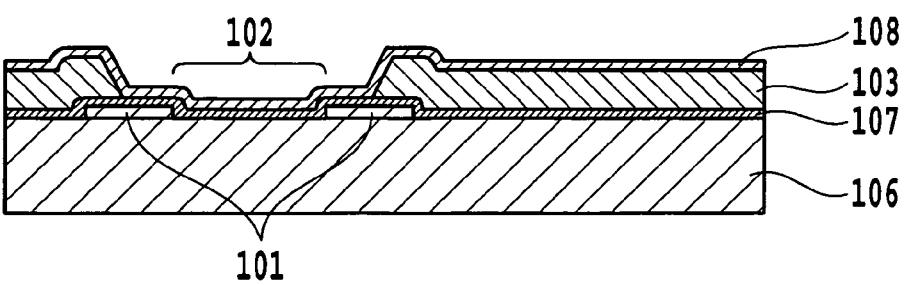

Next, as shown in FIG. 5D, to prevent the wire portions of the second electrodes 103 and the resistor layer 107 in the gaps of the second electrodes 103 from coming into direct contact with ink, a first protective insulation layer 108 of SiN is deposited by plasma CVD to a thickness of about 300 nm at approximately 400° C.

Further, to form an anticavitation layer 110, Ta is sputtered to a thickness of about 200 nm. Then, it is covered with a desired shape of resist patterned by photolithography, and then the Ta layer is etched into a desired pattern by reactive dry etching using $CF_4$. Now, an ink jet head circuit board as shown in FIG. 4 is obtained.

The ink jet head circuit board manufactured by the above process has formed over the substrate a pair of first electrodes spaced a first gap from each other and having a heater formed in the first gap; a resistor layer formed on the first electrodes; and a pair of second electrodes overlapping the paired first electrodes and having a second gap wider than the first gap. The first electrodes are formed of a corrosion resistant metal. This construction produces the following notable effects.

First, since the second electrodes 103 are arranged to overlap the first electrodes 101, the first electrodes 101 can be reduced in thickness while preventing a sudden increase in wire resistance. This can keep dimensional variations among the heaters small and improve a step coverage capability of the resistor layer and the overlying protective layers (108, 110). Further, when the second electrodes are patterned using a wet etching method, this is done outside the heater 102. So, the patterning of the second electrodes does not affect the heater dimensions at all. As a result, the heaters can be formed with high precision, which in turn helps meet the demand that resistors have an increased resistance and that heaters have a reduced area. Further, the improved step coverage of the protective layer results in higher reliability and durability.

Further, since the second electrodes 103 made of aluminum do not immediately face the heater 102, there is a reduced possibility of the second electrodes 103 being encroached upon if repetitive energization of the heater 102 should result in a failure of a protective layer above or near the heater 102. This in turn makes corrosions along the wires less likely to occur. The resistor layer is generally made of a material more resistant to encroachment than aluminum, and a material of the first electrodes is selected from among corrosion resistant metals. So, if defects should occur in a protective layer on or near the heater 102, a corrosion can be prevented more effectively than in the construction shown in FIG. 2.

That is, in the construction shown in FIG. 2, when a protective layer fails on or near the heater as it is repetitively energized, the wire facing the heater is encroached upon and is likely to fail. If the heater activation is continued even after the wire break has occurred, a wire corrosion due to electrolysis proceeds from the point of wire break. The ink jet head is often arranged for a block driving by which a predetermined number of heaters are commonly wired and energized as a unit block at one time. When such a wiring configuration is adopted, a wire failure even at one point will cause corrosions to spread to the entire block. This embodiment, however, can substantially reduce the possibility of occurrence of such a grave problem.

It may be conceived to form a resistor layer as an underlying layer of the first electrodes 101. In that case, to ensure that the underlying resistor layer is not encroached upon by the patterning of the first electrodes, i.e., by the processing performed to form heater, it is preferred that the material of the first electrode differ from that of the resistor layer (e.g., when the resistor layer 107 is formed of Ta or an alloy containing Ta, the first electrodes 101 may be made of a corrosion resistant metal other than at least Ta or an alloy containing Ta). Therefore, in forming the heater with high precision and increasing the degree of freedom of material selection, it is advantageous to form the resistor layer on the first electrodes 101 as in this embodiment.

The thickness of the first electrodes can be determined in a range that produces a desired effect without departing from the spirit of this invention. That is, in order to be able to form the heater with high dimensional precision and give the protective layer a good step coverage, the thickness of the first electrodes is preferably set equal to or less than 100 nm.

The corrosion resistant metals that may be used for the first electrodes include Ta, its alloy, Pt, its alloy and TiW. Appropriate processing can be performed according to the material selected.

When the first electrodes 101 made of, say, Ta, are formed on an insulation layer 106 of SiO, for example, a dry etching method such as RIE using a gas mixture of $Cl_2$ and $BCl_3$ as described above is performed. Although it has little effect on dimensional accuracy when compared with the wet etching, the dry etching can cause an overetch and reduce the thickness of the insulation layer 106 between the first electrodes, forming a step greater than the thickness of the first electrodes. This causes resistance variations among heaters, which in turn degrades the step coverage of the resistor layer 107 or the protective layers (108, 110).

Figure 6:
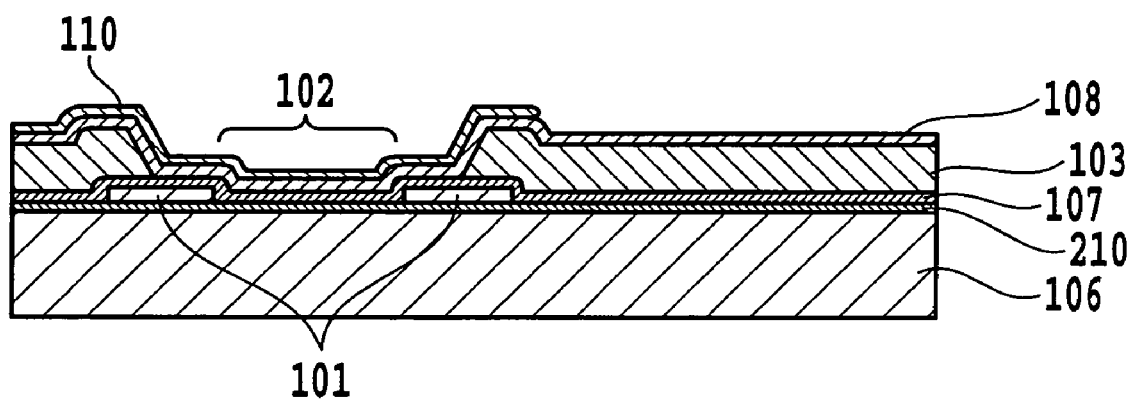
FIG. 6 is a schematic cross-sectional view showing a heater in an ink jet head circuit board according to a variation of the first embodiment.

To deal with this problem, it is recommended, as shown in FIG. 6, to form a SiC layer 210, which offers a higher etching selectivity than the SiO layer, as an underlying layer for the first electrodes 101, before depositing the first electrodes, thereby minimizing the effect of overetching.

Further, when the first electrodes use TiW for their material, for instance, a wet etching is performed. In that case, the etching selectivity with respect to the underlying insulation layer 106 can be improved if a water solution of hydrogen peroxide is used as an etching liquid. That is, since the magnitude by which the insulation layer 106 between the first electrodes is reduced in thickness becomes small, the resistor layer 107 or the protective layers (108, 110) that are subsequently formed have an improve step coverage, enhancing reliability of the circuit board and head.

(Second Embodiment of Ink Jet Head Circuit Board)

The second embodiment of this invention concerns an improvement on the first embodiment which more effectively suppresses an advancement of corrosion.

Figure 7A:
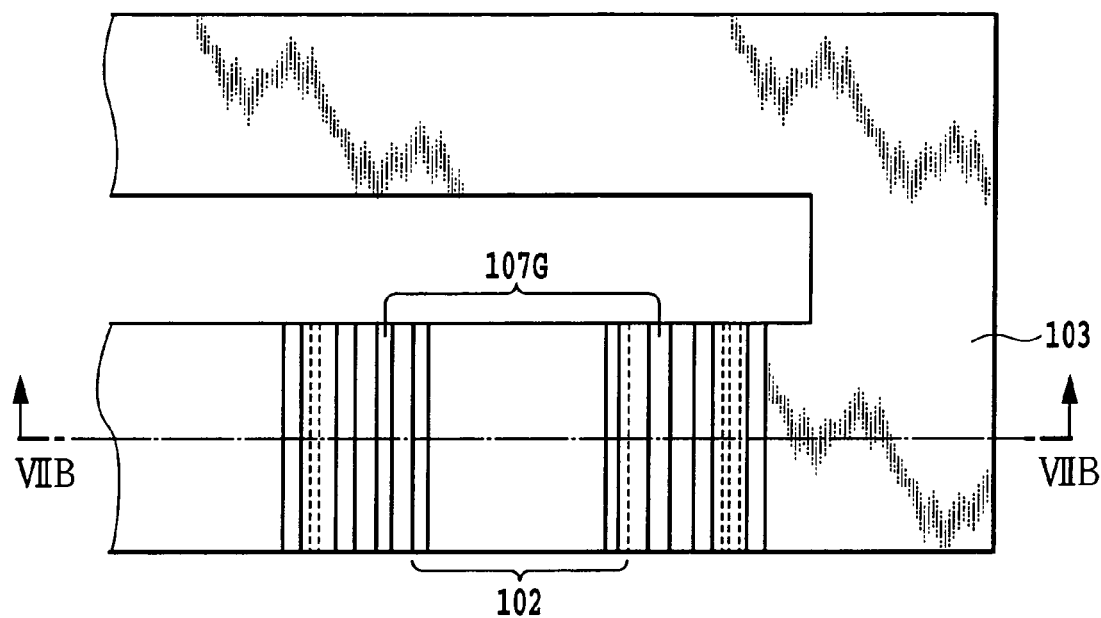
FIG. 7A and FIG. 7B are a schematic plan view and a schematic cross-sectional view showing a heater in an ink jet head circuit board according to a second embodiment of this invention.
Figure 7B:
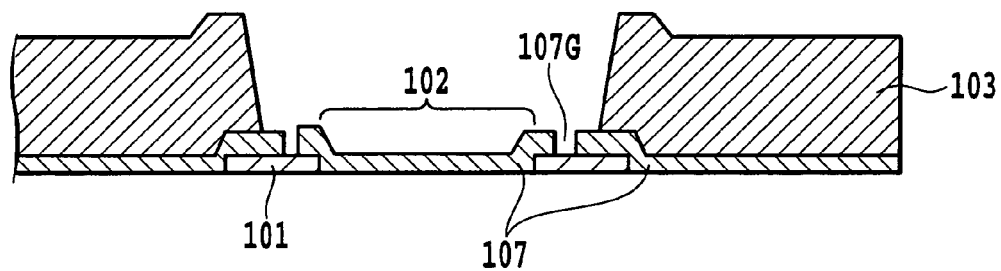

FIG. 7A and FIG. 7B are a schematic plan view showing a heater and its associated components in an ink jet head circuit board according to the second embodiment of this invention and a cross-sectional view taken along the line VIIb-VIIb of FIG. 7A. In these figures, components that function in the same way as those described above are given like reference numbers. For easy understanding of features, the substrate and protective layers are not shown.

In this embodiment, on the first electrodes 101 there are provided gaps 107G that cut across the resistor layer 107 in the width direction (in FIG. 7A, in a vertical direction). If there is a defect in the protective layer on or near the heater 102 and the resistor layer 107 is encroached upon through that defect, the progress of corrosion can be stopped by the gaps 107G.

Such gaps 107G can be formed by patterning the resistor layer 107 through etching using photolithography after the resistor layer 107 is formed, or after the second electrodes 103 are formed but before the first protective insulation layer 108 is formed. In this case, different materials may be used for the first electrodes and the resistor layer to ensure that the underlying first electrodes 101 are not encroached upon during the patterning process.

The construction of this embodiment can also be applied to the variation of the first embodiment and to a third embodiment described in the following.

(Third Embodiment of Ink Jet Head Circuit Board)

As described above, the ink jet heads that use thermal energy for ink ejection are under growing market pressure to increase the number of nozzles, make them smaller and integrate them at higher density in order to meet the demands for higher printing resolution, higher image quality and faster printing speed. For this purpose, it is necessary to increase the number of heaters arranged on the substrate, make them small and arrange them at high density. It is also necessary to enhance a thermal efficiency to reduce electricity consumption. From the standpoint of energy conservation, it is strongly desired that a resistance of electrode wires connected to resistors be reduced. Normally, the resistance of electrode wires is reduced by increasing the width of the electrode wires formed on the substrate. However, as the number of energy generation components formed on the substrate becomes very large for the reasons described above, a sufficient space to allow the electrode wires to be increased in width cannot be secured without increasing the size of the circuit board.

Figure 8A:
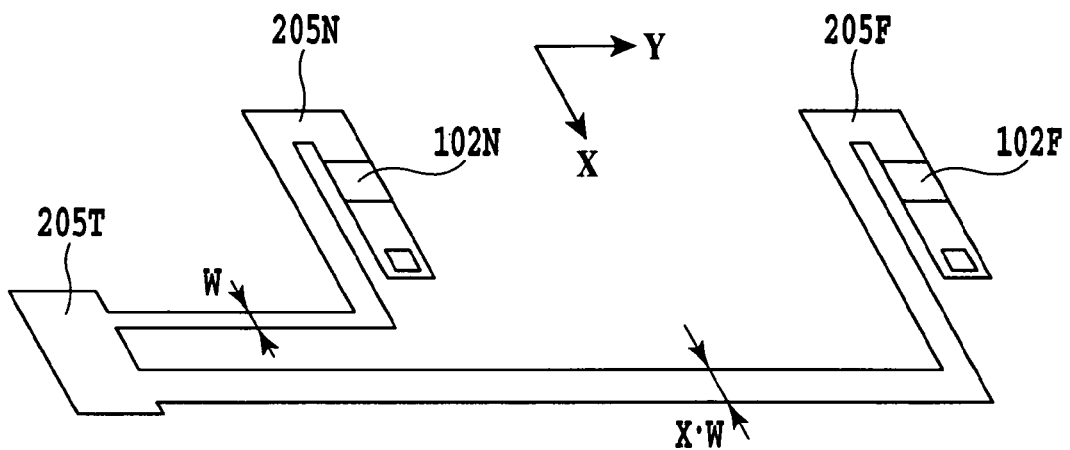
FIG. 8A and FIG. 8B show a problem with the conventional construction in reducing or equalizing resistances of electrode wires in the heaters and a superiority of a fundamental construction adopted by a third embodiment of this invention over the conventional construction.

This is explained by referring to FIG. 8A.

In FIG. 8A, suppose a wire pattern 205N for a heater 102N near a terminal 205T located at an end of the circuit board (not shown) has a width W in its wire portion extending in Y direction. Then, a wire pattern 205F for a heater 102F remote from the terminal 205T has a width x·W (x>1) in its wire portion extending in Y direction in the figure. This is because the distance from the terminal 205T to each heater, i.e., the length of wire, is not uniform and its resistance varies according to the distance from the terminal 205T. As described above, in a construction designed to reduce or equalize the wire resistances in the same plane, the circuit board is required to have an area that matches the sum of the widths of wire portions for individual heaters (the farther the heater is from the terminal, the larger the width of the associated wire portion becomes).

Therefore, when it is attempted to increase the number of heaters to achieve a higher resolution, a higher image quality and a faster printing speed, the size of the circuit board in X direction increases even more significantly, pushing up the cost and limiting the number of heaters that can be integrated. As for the wire portions in direct vicinity of the heater, increasing the width in Y direction to reduce the wire resistance can impose limitations on the intervals of heaters or the high density arrangement of nozzles.

To cope with this problem, the inventors of this invention studied a construction in which the electrode wires are formed in a plurality of stacking layers with a protective layer in between to prevent an increase in the size of the substrate or circuit board and realize a high density integration of the heaters.

Figure 8B:
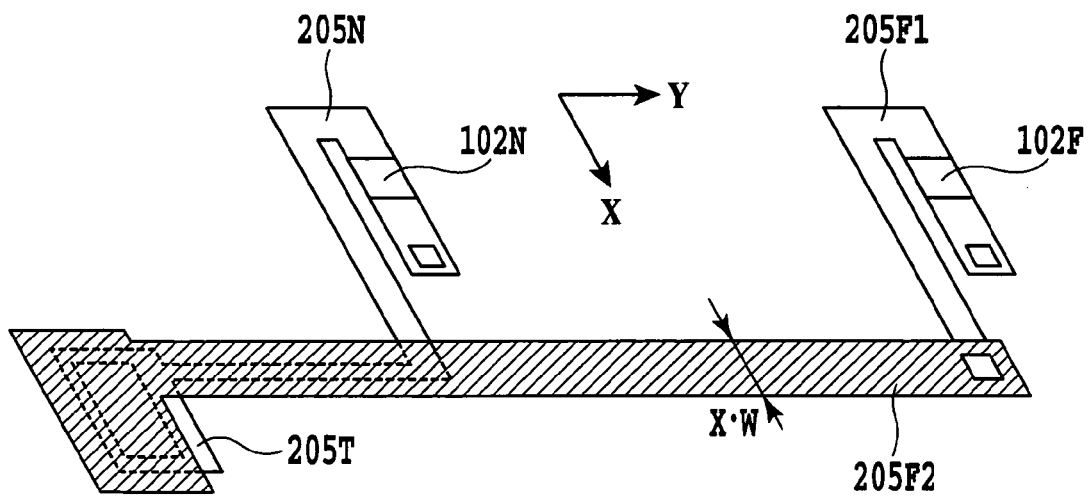

As shown in FIG. 8B, in a construction that forms electrode wires in a plurality of layers to reduce or equalize wire resistances, the wire pattern 205N for the heater 102N near the terminal 205T and the wire pattern 205F1 in direct vicinity of the heater 102F, which is remote from the terminal 205T, are both formed of the lower layer or the first electrode wire layer, and a wire portion 205F2 extending in Y direction to the wire portion 205F1 is formed of the upper layer or the second electrode wire layer, with the ends of the wire portion 205F2 connected to the terminal 205T and the wire portion 205F1 via through-holes. In this construction, the circuit board is only required to have an area large enough to accommodate the width (x·W) of the upper wire portion 205F2, making it possible to reduce the surface area of the circuit board while reducing or equalizing the wire resistance.

In addition to the fundamental construction described above, the third embodiment of this invention adopts a construction that further reduces or equalizes the wire resistances.

Figure 9:
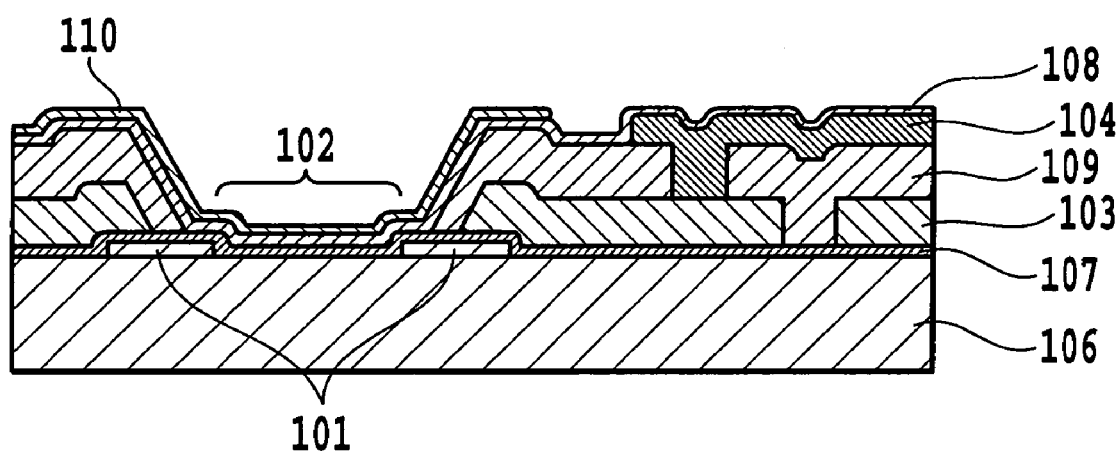
FIG. 9 is a schematic cross-sectional view showing a heater in the ink jet head circuit board according to the third embodiment of this invention.

FIG. 9 is a schematic cross-sectional view showing a heater in the ink jet head circuit board according to the third embodiment of this invention. In this figure, components that function in the same way as those of the first embodiment are assigned like reference numbers.

Over the second electrodes 103 an electrode wire layer 104 is formed, with a protective insulation layer 109 interposed therebetween. The second electrodes and the electrode wire layer are interconnected via a through-hole. Since the electrode wires are formed in multiple layers, the resistances of wires leading to the heaters can be reduced and equalized among the heaters without increasing the area of the electrode wires on the circuit board.

The circuit board of the above construction can be manufactured as follows.

First, in steps similar to those shown in FIG. 5A to FIG. 5C of the first embodiment, the insulation layer 106, the first electrodes 101 and the resistor layer 107 are successively deposited on the substrate to form the heater 102. This is followed by the second electrode 103 being deposited.

These layers are covered with a protective insulation layer 109, which is then etched away from above and from outside the heater 102, with the resistor layer 107 as an etch stopper. At the same time, the through-hole is formed in the protective insulation layer as necessary to connect the second electrode 103 and the electrode wire layer 104 to be formed later. Then, the electrode wire layer 104 is formed and patterned and subsequently covered with protective layers 108, 110.

The construction of this embodiment can also be applied to the variation of the first embodiment.

(Example Construction of Ink Jet Head and Process of Fabricating thereof)

Now, an ink jet head using the circuit board of one of the above embodiments will be explained.

Figure 10:
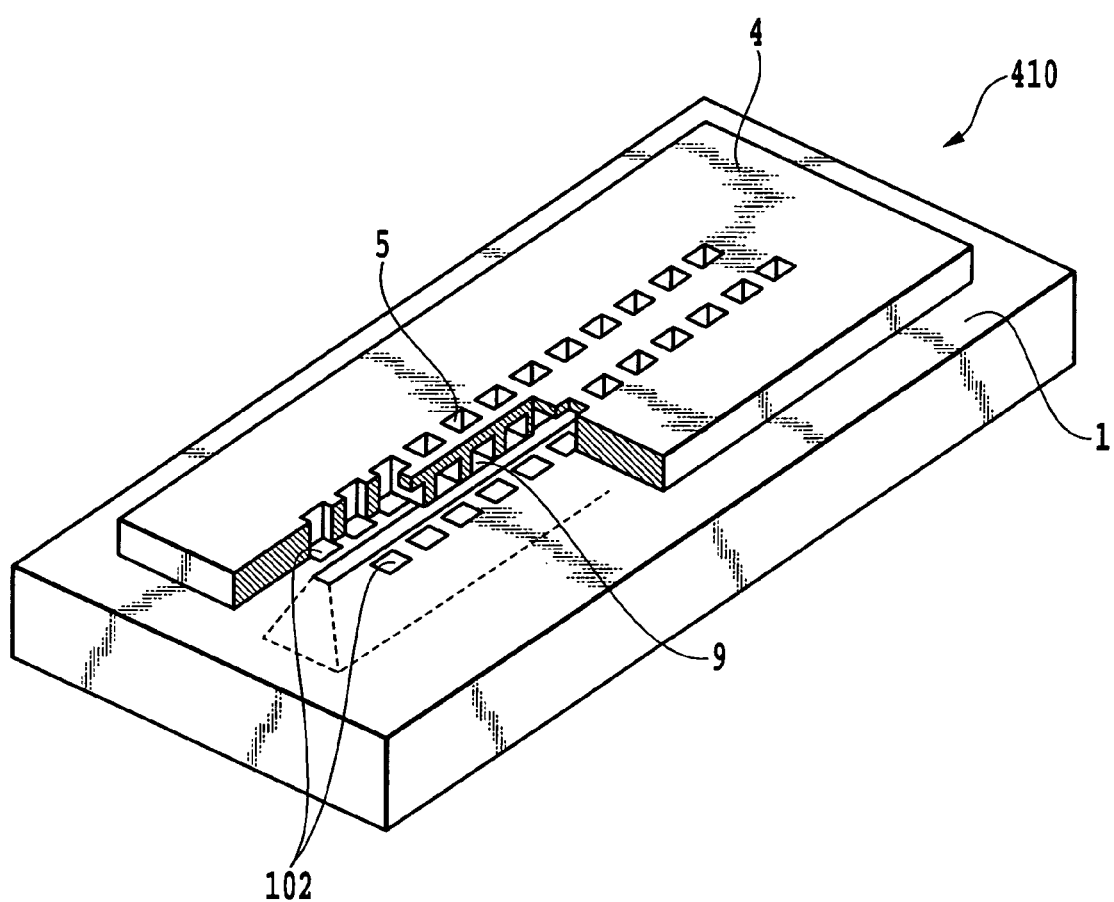
FIG. 10 is a perspective view showing an ink jet head using a circuit board of one of the first to third embodiment.

FIG. 10 is a schematic perspective view of an ink jet head.

This ink jet head has a circuit board 1 incorporating two parallel columns of heaters 102 arrayed at a predetermined pitch. Here, two circuit boards manufactured by the above process may be combined so that their edge portions where the heaters 102 are arrayed are opposed to each other, thus forming the two parallel columns of heaters 102. Or the above manufacturing process may be performed on a single circuit board to form two parallel columns of heaters in the board.

The circuit board 1 is joined with an orifice plate 4 to form an ink jet head 410. The orifice plate has formed therein ink ejection openings or nozzles 5 corresponding to the heaters 102, a liquid chamber (not shown) to store ink introduced from outside, ink supply ports 9 matched one-to-one to the nozzles 5 to supply ink from the liquid chamber to the nozzles, and a path communicating with the nozzles 5 and the supply ports 9.

Although FIG. 10 shows the two columns of heaters 102 and associated ink ejection nozzles 5 arranged line-symmetrical, they may be staggered by half-pitch to increase the print resolution.

FIG. 11A to FIG. 11D are schematic cross-sectional views showing a process of fabricating the ink jet head of FIG. 10.

The substrate for the circuit board 1 has been described to have a Si crystal orientation of <100> in those portions of a surface forming the heaters 102. Over a $SiO_2$ layer 307 on the back of the circuit board 1 a $SiO_2$ layer patterning mask 308 made of an alkali-proof masking material is formed, which is used to form an ink supply port 310. An example process of forming the $SiO_2$ layer patterning mask 308 is described as follows.

First, a mask material is spread over the entire surface on the back of the circuit board 1 as by spin coating to form the $SiO_2$ patterning mask 308, which is hardened by heat. Over the patterning mask 308, a positive resist is spin-coated and dried. Next, the positive resist is subjected to a photolithographic patterning and, with this patterned positive resist as a mask, the exposed part of the patterning mask 308 is removed by dry etching. After this, the positive resist is removed to obtain a desired pattern of the $SiO_2$ patterning mask 308.

Next, a skeleton member 303 is formed on the surface in which the heaters 102 are already formed. The skeleton member 303 is melted away in a later process to form ink paths where it was. That is, to form ink paths of a desired height and a desired plan-view pattern, the skeleton member 303 is formed into a shape of an appropriate height and plan-view pattern. The skeleton member 303 may be formed as follows.

As a material for the skeleton member 303 a positive photoresist, e.g., ODUR1010 (trade name, Tokyo Ohka Kogyo Co., Ltd make), is used. This material is applied to the circuit board 1 to a predetermined thickness as by spin coating or in the form of dry film laminate. Next, it is patterned by photolithography using ultraviolet light or deep UV light for exposure and development. Now, the skeleton member 303 of a desired thickness and plan-view pattern is obtained.

Figure 11A:
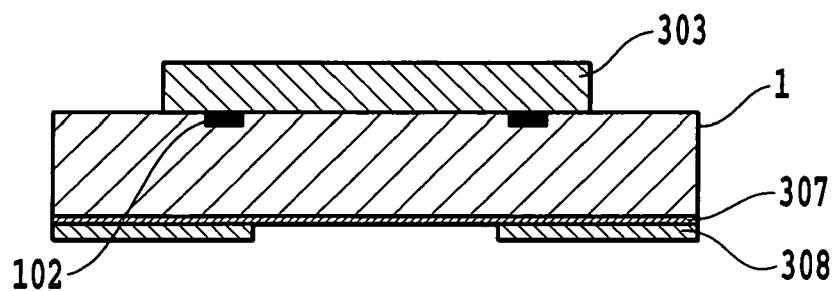
FIG. 11A to FIG. 11D are schematic cross-sectional views showing a process of fabricating the ink jet head of FIG. 10.
Figure 11B:
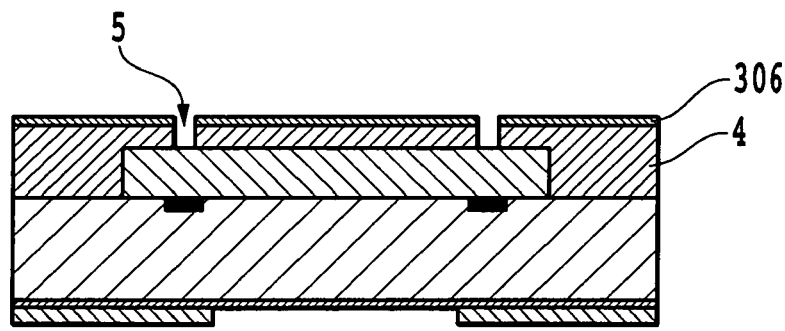
Figure 11C:
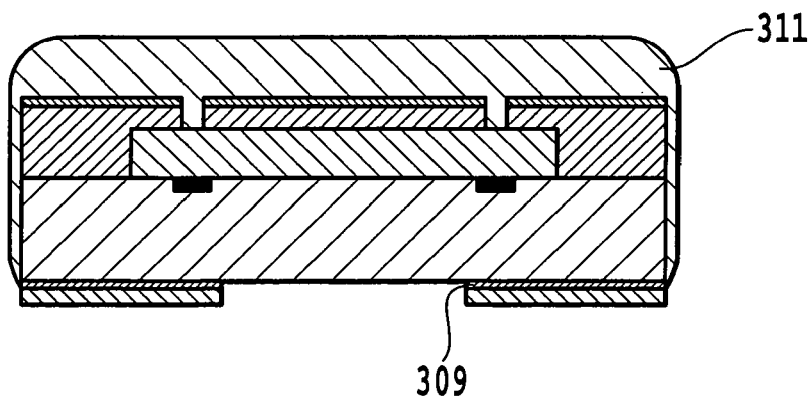
Figure 11D:
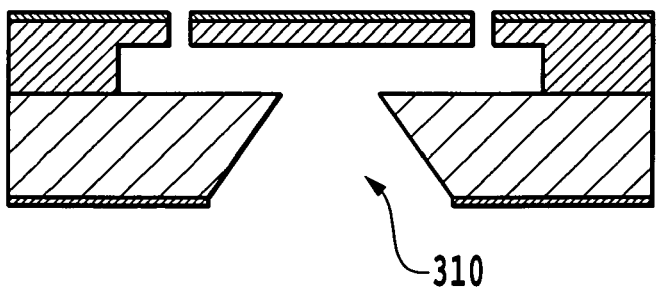

Next, in a step shown in FIG. 11B, a material of an orifice plate 4 is spin-coated to cover the skeleton member 303 that was formed on the circuit board 1 in a preceding step, and is then patterned into a desired shape by photolithography. At predetermined positions above the heaters 102, ink ejection openings or nozzles 5 are formed by photolithography. The surface of the orifice plate 4 in which the nozzles 5 are opened is covered with a water repellent layer 306 in the form of dry film laminate.

The orifice plate 4 may use a photosensitive epoxy resin and a photosensitive acrylic resin as its material. The orifice plate 4 defines ink paths and, when the ink jet head is in use, is always in contact with ink. So, photo-reactive, cationic polymers are particularly suited for its material. Further, because the durability of the material of the orifice plate 4 can change greatly depending on the kind and characteristic of the ink used, appropriate compounds other than the materials described above may be chosen according to the ink used.

Next, in a step shown in FIG. 1C, a resin protective material 311 is spin-coated to cover the surface of the circuit board 1 in which ink jet head functional elements are already formed and its sidewall surface in order to prevent an etching liquid from contacting these surfaces when forming the ink supply port 310 piercing through the circuit board 1. The protective material 311 must have a sufficient resistance to a strong alkaline solution used during anisotropic etching. By covering the upper surface of the orifice plate 4 with this protective material 311, degradation of the water repellent layer 306 can be avoided.

Next, using the SiO$_2$ layer patterning mask 308 which was prepared in the preceding step, the SiO$_2$ layer 307 is patterned as by wet etching to form an etch start opening 309 that exposes the back surface of the circuit board 1.

Next, in a step shown in FIG. 1D, the ink supply port 310 is formed by an anisotropic etching with the SiO$_2$ layer 307 as a mask. As an etching liquid for the anisotropic etching, a strong alkaline solution, such as TMAH (tetramethyl ammonium hydroxide) solution, may be used. Then, a solution of 22% by weight of TMAH is applied to the Si circuit board 1 from the etch start opening 309 for a predetermined time (for about a dozen hours) by keeping its temperature at 80° C. to form a piercing hole.

In a last step, the SiO$_2$ layer patterning mask 308 and the protective material 311 are removed. Then, the skeleton member 303 is melted and removed from the nozzles 5 and ink supply port 310. The circuit board is then dried. The removal of the skeleton member 303 is effected by exposing the entire surface of the circuit board to a deep UV light and then developing it. During the development, it may be subjected to ultrasonic dipping as required for virtually complete removal of the skeleton member 303.

With the above steps a main part of the ink jet head fabrication process is completed and the construction shown in FIG. 10 is obtained.

(Ink Jet Head Cartridge and Printing Apparatus)

This ink jet head can be mounted not only on such office equipment as printers, copying machines, facsimiles with a communication system and word processors with a printer unit but also on industrial recording apparatus used in combination with a variety of processing devices. The use of this ink jet head enables printing on a variety of print media, including paper, thread, fiber, cloth, leather, metal, plastic, glass, wood and ceramics. In this specification, a word "print" signifies committing to print media not only significant images such as characters and figures but also nonsignificant images such as patterns.

In the following, a cartridge comprising the above ink jet head combined with an ink tank and an ink jet printing apparatus using this unit will be explained.

Figure 12:
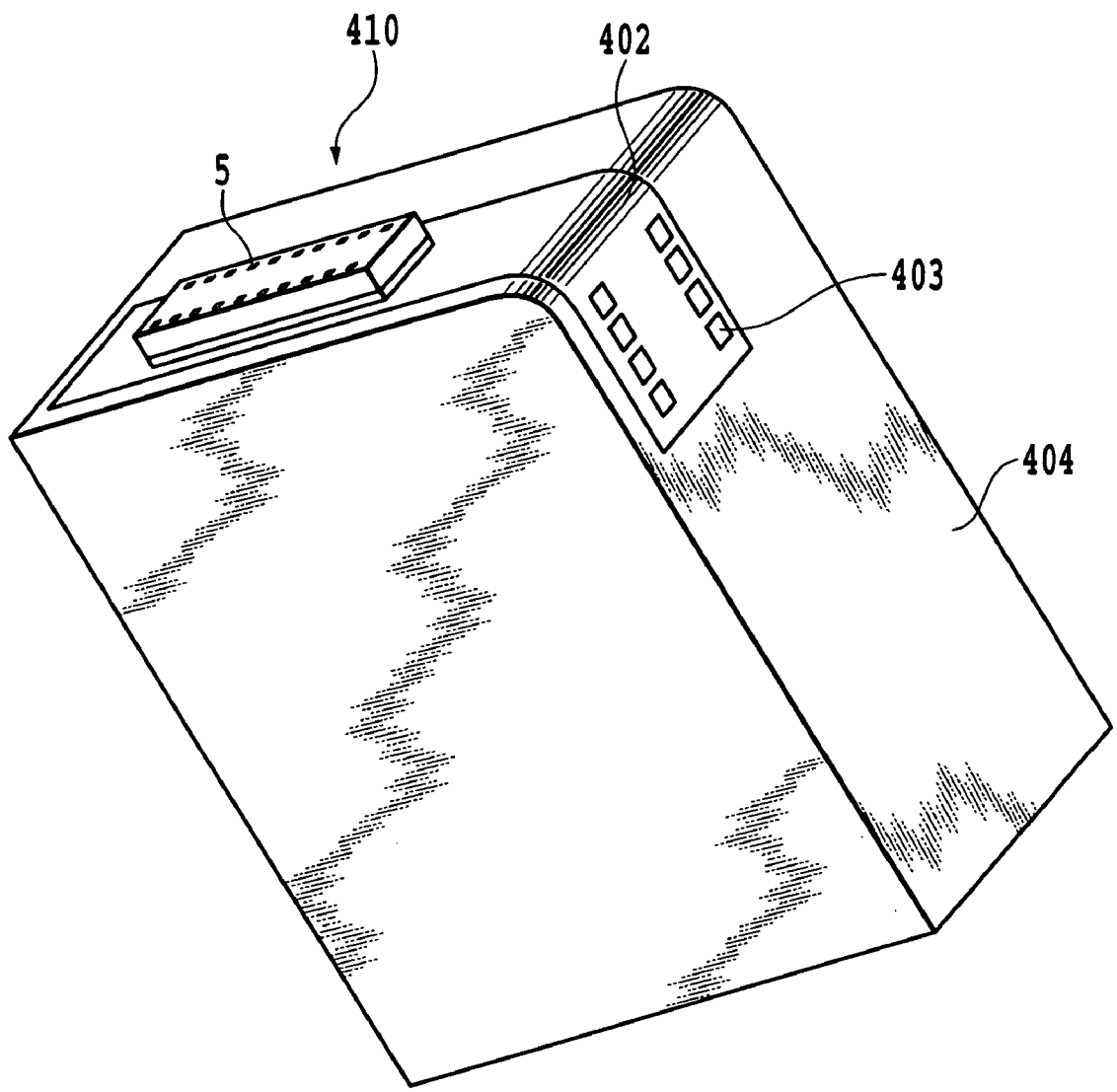
FIG. 12 is a perspective view showing an ink jet cartridge constructed of the ink jet head of FIG. 10.

FIG. 12 shows an example construction of an ink jet head unit of cartridge type incorporating the above ink jet head as its constitutional element. In the figure, denoted 402 is a TAB (tape automated bonding) tape member having terminals to supply electricity to the ink jet head 410. The TAB tape member 402 supplies electric power from the printer body through contacts 403. Designated 404 is an ink tank to supply ink to the head 410. The ink jet head unit of FIG. 12 has a cartridge form and thus can easily be mounted on the printing apparatus.

Figure 13:
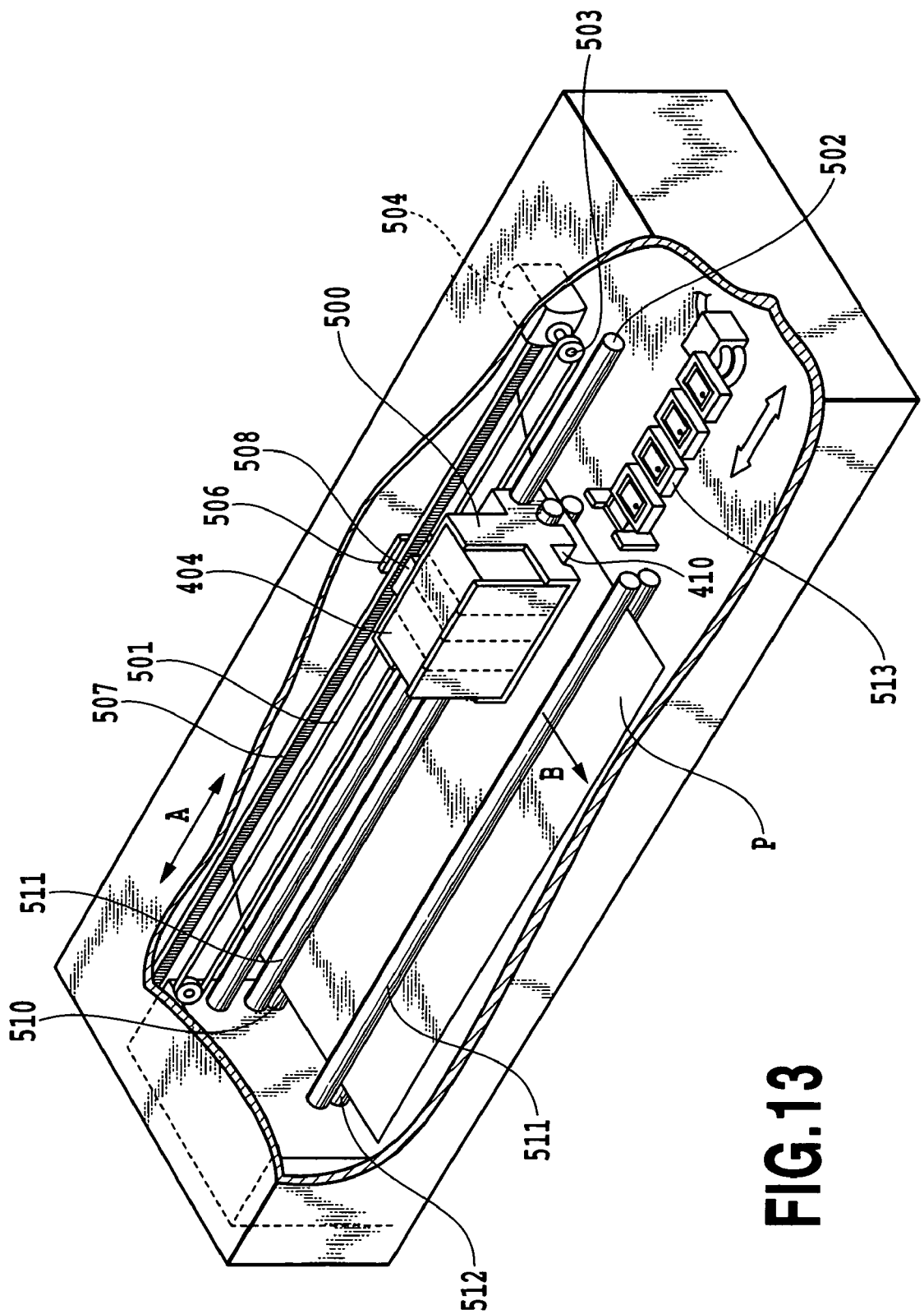
FIG. 13 is a schematic perspective view showing an outline construction of an ink jet printing apparatus using the ink jet cartridge of FIG. 12.

FIG. 13 schematically shows an example construction of an ink jet printing apparatus using the ink jet head unit of FIG. 12.

In the ink jet printing apparatus shown, a carriage 500 is secured to an endless belt 501 and is movable along a guide shaft 502. The endless belt 501 is wound around pulleys 503, 503 one of which is coupled to a drive shaft of a carriage drive motor 504. Thus, as the motor 504 rotates, the carriage 500 is reciprocated along the guide shaft 502 in a main scan direction (indicated by arrow A).

The ink jet head unit of a cartridge type is mounted on the carriage 500 in such a manner that the ink ejection nozzles 5 of the head 410 oppose paper P as a print medium and that the direction of the nozzle column agrees with other than the main scan direction (e.g., a subscan direction in which the paper P is fed). A combination of the ink jet head 410 and an ink tank 404 can be provided in numbers that match the number of ink colors used. In the example shown, four combinations are provided to match four colors (e.g., black, yellow, magenta and cyan).

Further, in the apparatus shown there is provided a linear encoder 506 to detect an instantaneous position of the carriage in the main scan direction. One of two constitutional elements of the linear encoder 506 is a linear scale 507 which extends in the direction in which the carriage 500 moves. The linear scale 507 has slits formed at predetermined, equal intervals. The other constitutional element of the linear encoder 506 includes a slit detection system 508 having a light emitter and a light sensor, and a signal processing circuit, both provided on the carriage 500. Thus, as the carriage 500 moves, the linear encoder 506 outputs a signal for defining an ink ejection timing and carriage position information.

The paper P as a print medium is intermittently fed in a direction of arrow B perpendicular to the scan direction of the carriage 500. The paper is supported by a pair of roller units 509, 510 on an upstream side of the paper feed direction and a pair of roller units 511, 512 on a downstream side so as to apply a constant tension to the paper to form a planar surface for the ink jet head 410 as it is transported. The drive force for the roller units is provided by a paper transport motor not shown.

In the above construction, the entire paper is printed by repetitively alternating the printing operation of the ink jet head 410 as the carriage 500 scans and the paper feed operation, each printing operation covering a band of area whose width or height corresponds to a length of the nozzle column in the head.

The carriage 500 stops at a home position at the start of a printing operation and, if so required, during the printing operation. At this home position, a capping member 513 is provided which caps a face of each ink jet head 410 formed with the nozzles (nozzle face). The capping member 513 is connected with a suction-based recovery means (not shown) which forcibly sucks out ink from the nozzles to prevent nozzle clogging.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

This application claims priority from Japanese Patent Application No. 2004-236605 filed Aug. 16, 2004, which is hereby incorporated by reference herein.

What is claimed is:

1. An ink jet head circuit board having heaters to generate thermal energy for ejecting ink as they are energized, the ink jet head circuit board comprising:

first electrodes having a gap therebetween in which to form the heater;

a resistor layer formed on the first electrodes including the gap; and second electrodes formed on the first electrodes and having a gap larger than the gap of the first electrodes, wherein the first electrodes have a thickness smaller than that of the second electrodes, wherein the first electrodes are formed of a corrosion resistant metal, wherein the corrosion resistant metal includes Ta, Pt and an alloy containing at least one of them, and wherein a SiC layer is formed as an underlying layer of the first electrodes.

2. The ink jet head circuit board according to claim 1, wherein the resistor layer is split over the first electrodes.

3. The ink jet head circuit board according to claim 1, further including an electrode wire layer formed on the second electrodes through a protective layer and electrically connected to the second electrodes.

4. The ink jet head circuit board according to claim 1, wherein the thickness of the first electrodes is equal to or less than 100 nm.

5. An ink jet head comprising: an ink jet head circuit board described in claim 1; and ink ejection nozzles corresponding to the heaters.

6. An ink jet head circuit board having heaters to generate thermal energy for ejecting ink as they are energized, the ink jet head circuit board comprising:

first electrodes having a gap therebetween in which to form the heater;

a resistor layer formed on the first electrodes including the gap; and second electrodes formed on the first electrodes and having a gap larger than the gap of the first electrodes, wherein the first electrodes have a thickness smaller than that of the second electrodes, and wherein the resistor layer is split over the first electrodes.

7. The ink jet head circuit board according to claim 6, wherein the first electrodes are formed of a corrosion resistant metal.

8. The ink jet head circuit board according to claim 7, wherein the corrosion resistant metal includes Ta, Pt and an alloy containing at least one of them.

9. The ink jet head circuit board according to claim 8, wherein the corrosion resistant metal is TiW.

10. The ink jet head circuit board according to claim 6, further including an electrode wire layer formed on the second electrodes through a protective layer and electrically connected to the second electrodes.

11. The ink jet head circuit board according to claim 6, wherein the thickness of the first electrodes is equal to or less than 100 nm.

12. An ink jet head comprising: an ink jet head circuit board described in claim 6; and ink ejection nozzles corresponding to the heaters.

13. An ink jet head circuit board having heaters to generate thermal energy for ejecting ink as they are energized, the ink jet head circuit board comprising:

first electrodes having a gap therebetween in which to form the heater;

a resistor layer formed on the first electrodes including the gap;

second electrodes formed on the first electrodes and having a gap larger than the gap of the first electrodes; and an electrode wire layer formed on the second electrodes through a protective layer and electrically connected to the second electrodes, wherein the first electrodes have a thickness smaller than that of the second electrodes.

14. The ink jet head circuit board according to claim 13, wherein the first electrodes are formed of a corrosion resistant metal.

15. The ink jet head circuit board according to claim 14, wherein the corrosion resistant metal includes Ta, Pt and an alloy containing at least one of them.

16. The ink jet head circuit board according to claim 15, wherein the corrosion resistant metal is TiW.

17. The ink jet head circuit board according to claim 13, wherein the thickness of the first electrodes is equal to or less than 100 nm.

18. An ink jet head comprising: an ink jet head circuit board described in claim 13; and ink ejection nozzles corresponding to the heaters.

* * * * *